(12) United States Patent
Hayashida et al.

(10) Patent No.: US 7,932,000 B2
(45) Date of Patent: *Apr. 26, 2011

(54) HOLOGRAM RECORDING MEDIUM

(75) Inventors: Naoki Hayashida, Tokyo (JP); Atsuko Kosuda, Tokyo (JP); Jiro Yoshinari, Tokyo (JP)

(73) Assignee: TDK Corporation, Tokyo (JP)

( * ) Notice: Subject to any disclaimer, the term of this patent is extended or adjusted under 35 U.S.C. 154(b) by 688 days.

This patent is subject to a terminal disclaimer.

(21) Appl. No.: 11/847,831

(22) Filed: Aug. 30, 2007

(65) Prior Publication Data
US 2008/0057406 A1  Mar. 6, 2008

(30) Foreign Application Priority Data
Sep. 1, 2006 (JP) .................. 2006-238342

(51) Int. Cl.
*G03H 1/02* (2006.01)
(52) U.S. Cl. .................. 430/2; 430/281.1; 430/1; 359/3
(58) Field of Classification Search .................. None
See application file for complete search history.

(56) References Cited

U.S. PATENT DOCUMENTS

| | | | |
|---|---|---|---|
| 4,187,111 A * | 2/1980 | Chandross et al. ............ 430/2 |
| 6,268,089 B1 | 7/2001 | Chandross et al. |
| 6,479,193 B1 | 11/2002 | Maeda et al. |
| 6,524,771 B2 | 2/2003 | Maeda et al. |
| 7,169,375 B2 * | 1/2007 | Chisholm ................. 423/592.1 |
| 2002/0110740 A1 | 8/2002 | Otaki et al. |
| 2005/0068593 A1 * | 3/2005 | Hayase et al. ................... 359/1 |
| 2006/0056036 A1 * | 3/2006 | Suzuki et al. ................. 359/642 |
| 2006/0172203 A1 * | 8/2006 | Mizushima ..................... 430/1 |
| 2007/0095736 A1 * | 5/2007 | Malik et al. ................ 210/198.2 |
| 2007/0111107 A1 | 5/2007 | Yoshinari et al. |
| 2007/0111108 A1 | 5/2007 | Hayashida et al. |
| 2007/0243474 A1 * | 10/2007 | Mizushima et al. .............. 430/2 |
| 2008/0057404 A1 * | 3/2008 | Kosuda et al. .................. 430/2 |

(Continued)

FOREIGN PATENT DOCUMENTS

JP  5-279598  10/1993

(Continued)

OTHER PUBLICATIONS

Lou et al. "Anhydrous sol-gel synthesis of titania-doped siloxane polymer for integrated optics" J. Sol-Gel Sci & Technol. vol. 32 pp. 297-301 (2004).*

(Continued)

*Primary Examiner* — Martin J Angebranndt
(74) *Attorney, Agent, or Firm* — Oblon, Spivak, McClelland, Maier & Neustadt, L.L.P.

(57) ABSTRACT

The present invention provides a hologram recording medium which can attain high refractive index change, flexibility, high sensitivity, low scattering, environment resistance, durability, low dimension change (low shrinkage) and high multiplicity in holographic memory record using a blue laser. A hologram recording medium (11) comprising at least a hologram recording material layer, wherein the hologram recording material layer (21) comprises at least: an organometallic compound having at least a Ti—O bond, and a photopolymerizable compound; and said medium has a light transmittance is 50% or more at a wavelength of 405 nm, or a light reflectance is 25% or more at a wavelength of 405 nm. The organometallic compound is favorably obtained by subjecting an alkoxide compound of the corresponding metal(s) to hydrolysis and polymerization reaction in an organic solvent which neither contains cyclic ether skeleton nor carbonyl oxygen.

8 Claims, 2 Drawing Sheets

U.S. PATENT DOCUMENTS

| | | | | |
|---|---|---|---|---|
| 2008/0057405 | A1* | 3/2008 | Yoshinari et al. | 430/2 |
| 2008/0076033 | A1* | 3/2008 | Hayashida et al. | 430/2 |
| 2008/0145307 | A1* | 6/2008 | Kosuda et al. | 423/608 |
| 2008/0160421 | A1* | 7/2008 | Hayashida et al. | 430/2 |
| 2008/0193857 | A1* | 8/2008 | Kosuda et al. | 430/2 |
| 2008/0254375 | A1* | 10/2008 | Hayashida et al. | 430/2 |
| 2008/0268349 | A1* | 10/2008 | Kosuda et al. | 430/2 |
| 2009/0091810 | A1* | 4/2009 | Yoshinari et al. | 359/3 |
| 2009/0092904 | A1* | 4/2009 | Hayashida et al. | 430/2 |
| 2009/0097085 | A1* | 4/2009 | Hayashida et al. | 359/3 |
| 2009/0163683 | A1* | 6/2009 | Kim et al. | 526/261 |
| 2009/0186281 | A1* | 7/2009 | Kosuda et al. | 430/2 |

FOREIGN PATENT DOCUMENTS

| | | |
|---|---|---|
| JP | 6-148880 | 5/1994 |
| JP | 2953200 | 7/1999 |
| JP | 11-344917 | 12/1999 |
| JP | 2002-236439 | 8/2002 |
| JP | 2002-236440 | 8/2002 |
| JP | 2003-43903 | 2/2003 |
| JP | 2005-321674 | 11/2005 |
| WO | WO 2005/109115 A1 | 11/2005 |
| WO | WO 2005/109116 A1 | 11/2005 |

OTHER PUBLICATIONS

Schafer et al. "Two-photon absorption cross sections of common photoiniaitors" J. Photochem. Photobiol A: Chem., vol. 162 pp. 497-502 (2004).*

Zhang et al. "Stabilized dispersions of titania nanoparticles via sol-gel process . . . ", Polym. Int. vol. 44(4) pp. 466-472 (Mar. 2006).*

Segawa et al. "Periodic structures of organic titania hybrid materials.." J. Sol. Gel.Sci. Technol., vol. 32 pp. 287-291 (2004).*

Kintaka et al. "Diffraction gratings of photosensitive ZrO2 gel films . . . " Appl. Opt. vol. 39(4) pp. 489-493 (Feb. 2000).*

Segawa et al. "Fabrication of photonic crystal structures by femptosecond laser induced . . . " J. Sol-Gel Sci & Technol. vol. 26 pp. 1023-1027 (2003).*

Yang et al. "Compositioonal tailored sol-gel . . . " J. Mater. Res. vol. 20 (11) pp. 3141-3149 (Nov. 2005).*

U.S. Appl. No. 11/953,325, filed Dec. 10, 2007, Kosuda, et al.

U.S. Appl. No. 11/964,464, filed Dec. 26, 2007, Hayashida, et al.

U.S. Appl. No. 12/021,686, filed Jan. 29, 2008, Kosuda, et al.

U.S. Appl. No. 12/356,979, filed Jan. 21, 2009, Kosuda, et al.

U.S. Appl. No. 11/859,992, filed Sep. 24, 2007, Hayashida, et al.

U.S. Appl. No. 11/847,730, filed Aug. 30, 2007, Kosuda, et al.

U.S. Appl. No. 11/847,819, filed Aug. 30, 2007, Yoshinari, et al.

U.S. Appl. No. 12/061,971, filed Apr. 3, 2008, Hayashida, et al.

U.S. Appl. No. 12/109,000, filed Apr. 24, 2008, Kosuda, et al.

U.S. Appl. No. 11/579,821, filed Nov. 7, 2006, Tetsuro Mizushima, et al.

U.S. Appl. No. 11/579,536, filed Nov. 3, 2006, Tetsuro Mizushima, et al.

T. Shimura, "Holographic Memory", O plus E, vol. 25, No. 4, 2003, pp. 385-390.

U.S. Appl. No. 12/556,965, filed Sep. 10, 2009, Hayashida, et al.

U.S. Appl. No. 12/236,123, filed Sep. 23, 2008, Yoshinari, et al.

U.S. Appl. No. 12/243,077, filed Oct. 1, 2008, Hayashida, et al.

U.S. Appl. No. 12/235,958, filed Sep. 23, 2008, Hayashida, et al.

Notification of Reasons for Refusal issued Nov. 16, 2010 in connection with corresponding Japanese Application No. 2006-238342, filed Sep. 1, 2006.

* cited by examiner

HOLOGRAM RECORDING MEDIUM

BACKGROUND OF THE INVENTION

1. Field of the Invention

The present invention relates to a hologram recording medium having a hologram recording material layer suitable for volume hologram record. The present invention relates in particular to a hologram recording medium having a hologram recording material layer suitable for record/reproduction using a blue laser light.

2. Disclosure of the Related Art

Research and development of holographic memories have been advanced as large-capacity recording technique making high-speed transmission possible. O plus E, vol. 25, No. 4, 385-390 (2003) describes basic structures of holographic memories and a coming prospect thereof.

Examples of the property required for a hologram recording material include high refractive index change at the time of recording, high sensitivity, low scattering, environment resistance, durability, low dimensional change, and high multiplicity. About holographic memory record using a green laser, various reports have been made hitherto as follows.

As a hologram recording material, there is known a photopolymer material made mainly of an organic binder polymer and a photopolymerizable monomer. However, the photopolymer material has problems about environment resistance, durability and others. In order to solve the problems of the photopolymer material, attention has been paid to an organic-inorganic hybrid material made mainly of an inorganic matrix and a photopolymerizable monomer, and the hybrid material has been investigated. The inorganic matrix is excellent in environment resistance and durability.

For example, Japanese Patent No. 2953200 discloses a film for optical recording wherein a photopolymerizable monomer or oligomer and a photopolymerization initiator are contained in an inorganic substance network film. It is also disclosed that the brittleness of the inorganic network film is improved by modifying the inorganic network organically. However, the compatibility between the inorganic substance network and the photopolymerizable monomer or oligomer is bad. Therefore, a uniform film is not easily obtained. A specific disclosure of the publication is that a photosensitive layer having a thickness of about 10 μm (par. [0058]) is exposed to an argon laser having a wavelength of 514.5 nm (par. [0059]).

JP-A-11-344917 discloses an optical recording medium wherein an organic-inorganic hybrid matrix contains an optically active monomer. In the organic-inorganic hybrid matrix, a metal element has an alkyl group (a methyl group) or an aryl group (a phenyl group). However, the introduction of the methyl group makes it impossible to improve the compatibility between the hybrid matrix and the optically active monomer. The introduction of the phenyl group gives a more improvement in the compatibility than the introduction of the methyl group. However, the introduction of the phenyl group causes a fall in the curing speed of a hybrid matrix precursor ([0015] in the above publication). A specific disclosure of the publication is that record is made in a hologram recording layer having a thickness of 100 μm, using a YAG laser having a wavelength of 532 nm (Example, [0031]).

JP-A-2002-236439 discloses a hologram recording material comprising: a matrix made of an organic-inorganic hybrid polymer obtained by copolymerizing an organometallic compound containing an ethylenically unsaturated double bond and an organic monomer having an ethylenically unsaturated double bond, as main chain constituting components, and/or a hydrolyzed polycondensate thereof; a photopolymerizable compound; and a photopolymerization initiator. By the introduction of the large organic main chain component into the matrix material, the compatibility between the matrix and the photopolymerizable compound is improved. However, the introduction of the large organic main chain component permits the presence of a two-component structure of the organic main chain and an inorganic network in the matrix material. Thus, it appears that the matrix may not exhibit unified behavior at the time of recording so as to cause nonuniform recording. If the ratio of the organic main chain component in the matrix is large, the same problems as in the case of the above-mentioned photopolymer material, which uses an organic binder polymer, are caused. A specific disclosure of the publication is that a hologram recording material layer having a thickness of 20 μm (par. [0080]) is exposed to an argon laser having a wavelength of 514.5 nm (par. [0081]).

In order to solve the problems of the hologram recording materials disclosed in the above-mentioned individual publications, JP-A-2005-321674 discloses a hologram recording material comprising: an organometallic compound at least containing at least two kinds of metals (Si and Ti), oxygen, and an aromatic group, and having an organometallic unit wherein two aromatic groups are directly bonded to one metal (Si); and a photopolymerizable compound. In Example 1 of the publication (in particular, pars. [0074] to [0078]), it is disclosed that a hologram recording medium which has a layer of the above-mentioned hologram recording material having a thickness of 100 μm gave a high transmittance, a high refractive index change, a low scattering, and a high multiplicity in record using a Nd:YAG laser (532 nm).

SUMMARY OF THE INVENTION

Any of the above-mentioned publications disclose holographic memory record using a green laser, but do not disclose holographic memory record using a blue laser.

An object of the present invention is to provide a hologram recording medium suitable for holographic memory record using a blue laser. More specifically, an object of the present invention is to provide a hologram recording medium which has a hologram recording material layer suitable for volume hologram record and can attain high refractive index change, flexibility, high sensitivity, low scattering, environment resistance, durability, low dimensional change (low shrinkage) and high multiplicity in holographic memory record using a blue laser.

The present inventors have made investigations, so as to find out that when a blue laser is used to make a holographic memory record in the hologram recording medium disclosed in JP-A-2005-321674, the transmittance thereof falls so that good holographic memory recording characteristics cannot be obtained. When a transmittance falls, holograms (interference fringes) are unevenly formed in the recording layer along the thickness direction of the recording layer so that scattering-based noises and the like are generated. It has been found out that in order to obtain good hologram image characteristics, it is necessary that the medium has a light transmittance of 50% or more.

A light transmittance of a hologram recording layer depends on a thickness thereof. As the thickness of the recording layer is made smaller, the light transmittance is improved; however, the widths of diffraction peaks obtained when reproducing light is irradiated into a recorded pattern become larger so that separability between adjacent diffraction peaks deteriorates. Accordingly, in order to obtain a sufficient SN ratio, it is indispensable to make a shift interval (an angle or the like) large when multiple record is made. For this reason, a high multiplicity cannot be attained. In the use of a hologram recording medium in any recording system, the thickness of its recording layer is required to be at lowest 100 µm in order to attain holographic memory recording characteristics for ensuring a high multiplicity.

The present invention includes the followings:

(1) A hologram recording medium comprising at least a hologram recording material layer,
wherein the hologram recording material layer comprises at least:
an organometallic compound having at least a Ti—O bond and
a photopolymerizable compound; and
said hologram recording medium has a light transmittance of 50% or more at a wavelength of 405 nm, or a light reflectance of 25% or more at a wavelength of 405 nm.

(2) The hologram recording medium according to the above-described (1), wherein the organometallic compound further has a Si—O bond.

(3) The hologram recording medium according to the above-described (1) or (2), wherein the hologram recording material layer further comprises a photopolymerization initiator.

(4) The hologram recording medium according to any one of the above-described (1) to (3), wherein the organometallic compound is obtained by subjecting an alkoxide compound of the corresponding metal(s) to a hydrolysis and a polymerization reaction in an organic solvent which neither contains any cyclic ether skeleton nor any carbonyl oxygen.

(5) The hologram recording medium according to the above-described (4), wherein the organic solvent is selected from the group consisting of monoalcohol, dialcohol, and monoalkyl ether of dialcohol.

(6) The hologram recording medium according to any one of the above-described (1) to (5), wherein the hologram recording material layer has a thickness of at least 100 µm.

(7) The hologram recording medium according to any one of the above-described (1) to (6), wherein record/reproduction of said hologram recording medium are made using a laser light having a wavelength of 350 to 450 nm.

(8) A process for producing a hologram recording medium comprising at least a hologram recording material layer, wherein the hologram recording material layer comprises at least:
an organometallic compound having at least a Ti—O bond and
a photopolymerizable compound; and
said hologram recording medium has a light transmittance of 50% or more at a wavelength of 405 nm, or a light reflectance of 25% or more at a wavelength of 405 nm,
the process comprising the steps of:
subjecting an alkoxide compound of the corresponding metal(s) (which contains at least an alkoxide compound of Ti) to hydrolysis and condensation reaction in an organic solvent which neither contains cyclic ether skeleton nor carbonyl oxygen, thereby yielding an organometallic compound or a precursor thereof,
incorporating a photopolymerizable compound into the resultant system before, during or after the hydrolysis, thereby yielding a sol-state hologram recording material; and
applying the sol-state hologram recording material on a substrate, and drying the material while advancing the polycondensation reaction further, thereby yielding a hologram recording material layer comprising, at least, the organometallic compound having at least a Ti—O bond, and the photopolymerizable compound.

According to the present invention, the hologram recording material layer contains, as the matrix material thereof, the organometallic compound having a Ti—O bond (organic group-containing metal oxide); therefore, a high refractive index of the matrix material can be obtained. For this reason, the hologram recording medium is a medium having a light transmittance of 50% or more at a wavelength of 405 nm or a light reflectance of 25% or more at a wavelength of 405 nm while maintaining the high refractive index of the matrix material. Thus, in holographic memory record using a blue laser, good holographic memory record characteristics can be obtained without lowering the light transmittance of the recording material layer nor that of the medium.

DETAILED DESCRIPTION OF THE INVENTION

Figure 1:
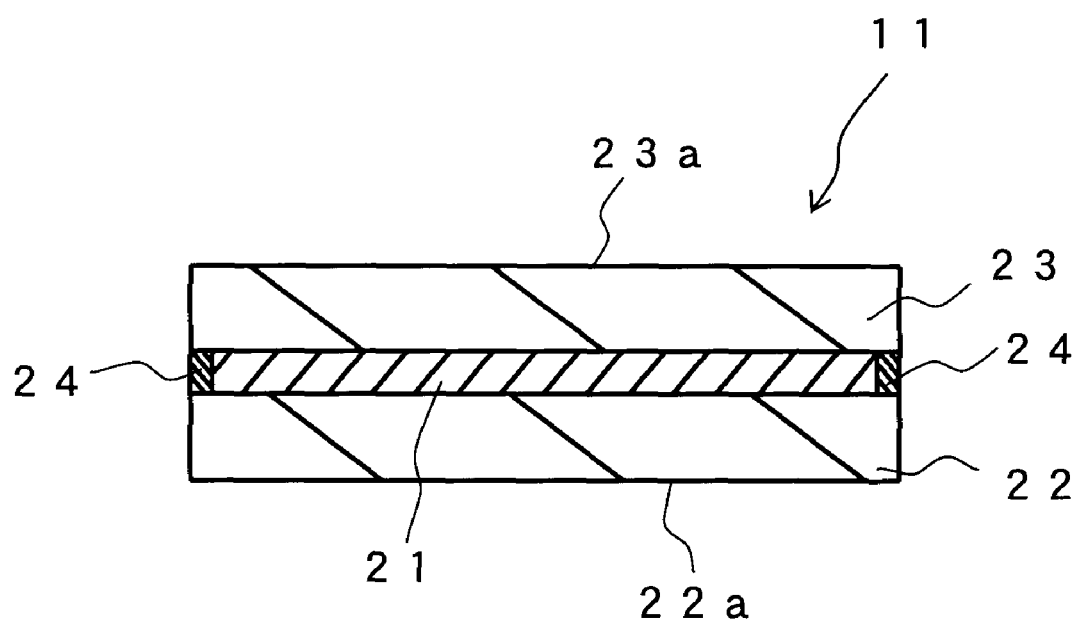
FIG. 1 is a view illustrating a schematic cross section of a hologram recording medium produced in an example.

The hologram recording medium of the present invention comprises at least a hologram recording material layer. Usually, a hologram recording medium comprises a supporting substrate (i.e., a substrate) and a hologram recording material layer; however, a hologram recording medium may be made only of a hologram recording material layer without having any supporting substrate. For example, a medium composed only of a hologram recording material layer may be obtained by forming the hologram recording material layer onto the substrate by application, and then peeling the hologram recording material layer off from the substrate.

The hologram recording medium of the present invention has a light transmittance of 50% or more at a wavelength of 405 nm, or has a light reflectance of 25% or more at a wavelength of 405 nm. In other words, in the case of performing reproduction using transmitted light, the hologram recording medium of the present invention has a light transmittance of 50% or more at a wavelength of 405 nm, and in the case of performing reproduction using reflected light, the hologram recording medium of the present invention has a light reflectance of 25% or more at a wavelength of 405 nm.

The hologram recording medium is either of a medium having a structure for performing reproduction using transmitted light (hereinafter referred to as a transmitted light reproducing type medium), and a medium having a structure for performing reproduction using reflected light (hereinafter referred to as a reflected light reproducing type medium) in accordance with an optical system used for the medium.

The transmitted light reproducing type medium is constructed in such a manner that a laser light for readout is irradiated into the medium, the laser light irradiated therein is diffracted by signals recorded in its hologram recording material layer, and the laser light transmitted through the medium is converted to electric signals by means of an image sensor. In other words, in the transmitted light reproducing type medium, the laser light to be detected is transmitted through the medium toward the medium side opposite to the medium side into which the reproducing laser light is irradiated. The transmitted light reproducing type medium usually has a structure wherein its recording material layer is sandwiched between two supporting substrates. In an optical system used for the medium, the image sensor, for detecting the transmitted laser light, is set up in the medium side opposite to the medium side into which the reproducing laser light emitted from a light source is irradiated.

Accordingly, in the transmitted light reproducing type medium, the supporting substrate, the recording material layer, and any other optional layer(s) are each made of a light-transmitting material. It is unallowable that any element blocking the transmission of the reproducing laser light is substantially present. The supporting substrate is usually a rigid substrate made of glass or resin.

In the meantime, the reflected light reproducing type medium is constructed in such a manner that a laser light for readout is irradiated into the medium, the laser light irradiated therein is diffracted by signals recorded in its hologram recording material layer, and then, the laser light is reflected on its reflective film, and the reflected laser light is converted to electric signals by means of an image sensor. In other words, in the reflected light reproducing type medium, the laser light to be detected is reflected toward the same medium side as the medium side into which the reproducing laser light is irradiated. The reflected light reproducing type medium usually has a structure wherein the recording material layer is formed on a supporting substrate positioned at the medium side into which the reproducing laser light is irradiated; and a reflective film and an another supporting substrate are formed on the recording material layer. In an optical system used for the medium, the image sensor, for detecting the reflected laser light, is set up in the same medium side as the medium side into which the reproducing laser light emitted from a light source is irradiated.

Accordingly, in the reflected light reproducing type medium, the supporting substrate positioned at the medium surface side into which the reproducing laser light is irradiated, the recording material layer, and other optional layer(s) positioned nearer to the medium side into which the reproducing laser light is irradiated than the reflective film are each made of a light-transmitting material. It is unallowable that these members each substantially contain an element blocking the incident or reflective reproducing laser light. The supporting substrate is usually a rigid substrate made of glass or resin. The supporting substrate positioned at the medium surface side into which the reproducing laser light is irradiated is required to have a light-transmitting property.

In any case of the transmitted light reproducing type medium and the reflected light reproducing type medium, it is important that the hologram recording material layer has a high light transmittance of, for example, 50% or more at a wavelength of 405 nm. For example, in the case of considering a layer (100 μm in thickness) composed only of the matrix material (organic group-containing metal oxide material), it is preferred that the layer has a high light transmittance of 90% or more at a wavelength of 405 nm.

In the hologram recording medium of the present invention, the hologram recording material layer is a layer made of a hologram recording material composition containing, as essential components thereof, an organometallic compound having at least a Ti—O bond (organic group-containing metal oxide) and a photopolymerizable compound.

It is preferred that the organometallic compound further has a Si—O bond. When the organometallic compound contains two or more kinds of metals as a constituent element, the characteristics such as the refractive index are easily controlled. Thus, such a case is preferred for the design of the recording material.

The organometallic compound is obtained by subjecting an alkoxide compound of the corresponding one or more kinds of metals to hydrolysis and polymerization reaction (the so-called sol-gel reaction). The compound is in a gel form or a sol form. The organometallic compound functions as a matrix or a dispersing medium for the photopolymerizable compound in the hologram recording material layer. That is, the photopolymerizable compound in a liquid phase is evenly dispersed with good compatibility in the organometallic compound in a gel- or sol-form.

When light having coherency is irradiated onto the hologram recording material layer, the photopolymerizable organic compound (monomer) undergoes polymerization reaction in the exposed portion so as to be polymerized, and further the photopolymerizable organic compound diffuses and shifts from the unexposed portion into the exposed portion so that the polymerization of the exposed portion further advances. As a result, an area where the polymer produced from the photopolymerizable organic compound is large in amount and an area where the polymer is small in amount are formed in accordance with the intensity distribution of the light. At this time, the organometallic compound shifts from the area where the polymer is large in amount to the area where the polymer is small in amount, so that the area where the polymer is large in amount becomes an area where the organometallic compound is small in amount and the area where the polymer is small in amount becomes an area where the organometallic compound is large in amount. In this way, the light exposure causes the formation of the area where the polymer is large in amount and the area where the organometallic compound is large in amount. When a refractive index difference exists between the polymer and the organometallic compound, a refractive index change is recorded in accordance with the light intensity distribution.

In order to obtain a better recording property in the hologram recording material, it is necessary that a difference is large between the refractive index of the polymer produced from the photopolymerizable compound and that of the organometallic compound. The refractive indexes of the polymer and the organometallic compound may be designed so as to make any one of the refractive indexes high (or low).

In the present invention, the organometallic compound contains Ti as the essential constituent element thereof; therefore, a high refractive index of the organometallic compound can be obtained. Accordingly, it is advisable to design the hologram recording material to cause the organometallic compound to have a high refractive index and cause the polymer to have a low refractive index. In the organometallic compound, the number of Ti and that of Si should be appropriately determined, considering a desired refractive index. For example, the number (s) of the Si, and the number (m) of Ti and any other optional metal (such as Zr, Ge, Sn, Al or Zn) preferably satisfy the following relationship:

$$0.3s \leq m \leq 3s.$$

As described above, Ti is a preferred constituent element of the organometallic compound from the viewpoint that Ti can realize a high refractive index. On the other hand, Ti has a drawback that Ti easily absorbs light having a wavelength in the blue wavelength region. Specifically, when the organometallic compound absorbs light having a wavelength in the blue wavelength region, the light transmittance of a hologram recording medium using such a hologram recording material layer lowers in holographic memory record using a blue laser.

The inventors have made eager investigations, so as to find out that at the time of synthesizing an organometallic compound (organic group-containing metal oxide) containing Ti as a constituent element by subjecting an alkoxide compound of the corresponding metal(s) (Ti and any other optional metal such as Si) to hydrolysis and polymerization reaction (the so-called sol-gel reaction), the absorption of blue light into the resultant organometallic compound can be decreased by using an organic solvent which neither contains cyclic ether skeleton nor carbonyl oxygen as an organic solvent. In other words, it has been understood that the absorption of blue light into the organometallic compound results from the organic group contained in the organometallic compound and further a complex of Ti (or coordination of Ti) formed between the compound and the organic solvent used in the sol-gel reaction.

Ether oxygen in cyclic ether skeleton and carbonyl oxygen are high in capability of coordinating to Ti. Accordingly, dioxane, tetrahydrofuran, N-methylpyrrolidone, dimethylformamide, dimethylacetamide, acetylacetone or the like should not be used.

Preferred examples of the organic solvent include monoalcohol, dialcohol, and monoalkyl ether of dialcohol. Specific examples thereof include monoalcohols such as methanol, ethanol, propanol, isopropanol, and butanol; dialcohols such as ethylene glycol, and propylene glycol; and monoalkyl ethers of dialcohols such as 1-methoxy-2-propanol, and ethylene glycol monomethyl ether (methyl cellosolve). Out of these, the solvent to be used may be appropriately selected. Alternatively, a mixed solvent of these solvents may be used, and water may be added thereto. These solvents are low in capability of coordinating to Ti. Alternatively, even if the solvents coordinate to Ti, no transition absorption band at a low energy level is generated. Accordingly, even if these solvents remain in the organometallic compound, the absorption of blue light into the resultant organometallic compound is decreased.

In the present invention, a preferred organometallic compound (organic group-containing metal oxide) which has flexibility will be described hereinafter.

In the present invention, in order to obtain a much better recording property in the hologram recording material, it is necessary that the diffusion/polymerization of the photopolymerizable compound is easily attained in the state that the photopolymerizable compound is present together with the organometallic compound. If the organometallic compound has flexibility, it functions as a matrix or a dispersing medium for the photopolymerizable compound so that the diffusion/polymerization of the photopolymerizable compound is easily attained. Thus, the refractive index change between the exposed portion and the unexposed portion becomes larger by irradiation of light.

In the present invention, the preferred organometallic compound at least contains at least two kinds of metals (M) including Ti and Si, oxygen, and an aromatic group (Ar), and has an organometallic unit (Ar-M-Ar) wherein two aromatic groups (Ar) are bonded directly to one metal (M). Such an organometallic compound has a flexibility.

The metals (M) are bonded to each other through the oxygen atom. The metals (M) other than Ti and Si are arbitrarily selected from the group consisting of, for example, Zr, Ge, Sn, Al and Zn. Only one kind of the two or more kinds of metals may constitute the organometallic unit, or the other kinds of metal(s) may also constitute the organometallic unit(s) of one or more different kinds. When the organometallic compound contains the two or more kinds of metals including Ti and Si as its constituting metals, the characteristics such as refractive index are easily controlled so that the recording material is easily designed.

The organometallic compound is produced by hydrolysis and polymerization reaction, what is called sol-gel reaction, using alkoxide compounds of the corresponding metal(s) (M) and diarylalkoxide compounds of the metal(s) (M) constituting the organometallic unit.

In the organometallic compound, it is preferred that the organometallic unit (Ar-M-Ar) is a unit (Ar—Si—Ar) wherein two aromatic groups are bonded directly to one Si atom. The diarylalkoxide compound of Si as a raw material is available at ease. However, it is not excluded that aromatic groups are bonded directly to the metal other than Si.

In the organometallic compound, it is more preferred that the organometallic unit (Ar-M-Ar) is a unit (Ph-Si-Ph) wherein two phenyl groups (Ph) are bonded directly to one Si atom. The diphenylalkoxide compound of Si as a raw material is available at ease, and the compound is good in reactivity for hydrolysis and polymerization. The phenyl groups may have a substituent.

The organometallic compound has an organometallic unit wherein two aromatic groups are bonded directly to one metal. Besides the organometallic unit, the organometallic compound may have an organometallic unit wherein one aromatic group is bonded directly to one metal, or may have an organometallic unit wherein three aromatic groups are bonded directly to one metal.

According to the introduction of the two aromatic groups (phenyl groups) into Si, the organometallic compound has good compatibility with the photopolymerizable compound described below and an organic polymer produced by the polymerization thereof. The refractive index of the organometallic compound also becomes high.

Preferred examples of the organometallic compound in the present invention include (I) and (II) represented by the following chemical formulae. In the examples, the alkoxide of Si is methoxide, and the alkoxide of Ti is butoxide. It is evident that other alkoxides are also allowable.

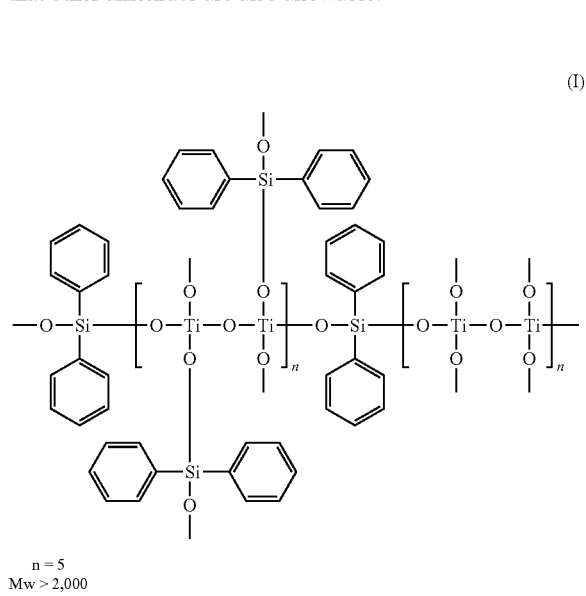

(I)

n = 5
Mw > 2,000

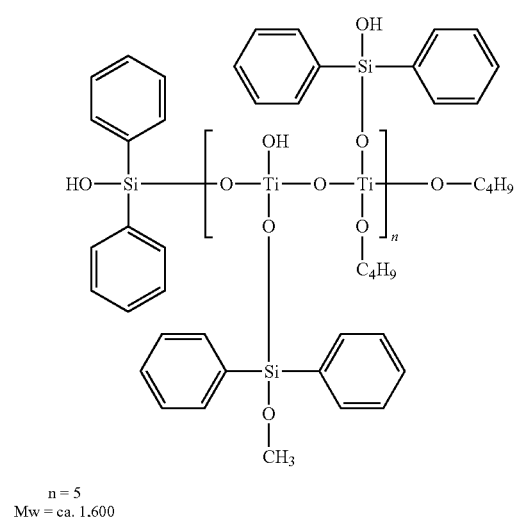

(II)
n = 5
Mw = ca. 1,600

These organometallic compounds can each be obtained by performing hydrolysis and polymerization reaction using a diphenylalkoxide compound of Si and an alkoxide compound of Ti. For example, the reaction formula in the case of using diphenyldimethoxysilane as the diphenylalkoxide compound of Si and a titanium butoxide oligomer as the alkoxide compound of Ti is represented by the following chemical formulae. The alkoxides of the both starting materials are hydrolyzed and then polymerized so that Si and Ti are bonded to each other through an oxygen atom. As a result, there can be obtained the organometallic compound containing Si and Ti as constituting metals, including diphenylsilane units, and having various molecular weights. In the chemical formulae, (I) and (II) are illustrated as examples of the organometallic compounds. That is, the organometallic compound is obtained in the form of a composition of organometallic compound variations having various molecular weights. This composition would include such compounds as a silane compound (III) containing no Ti.

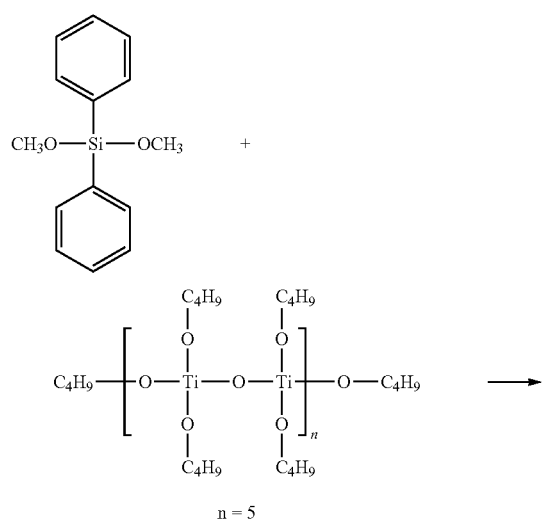

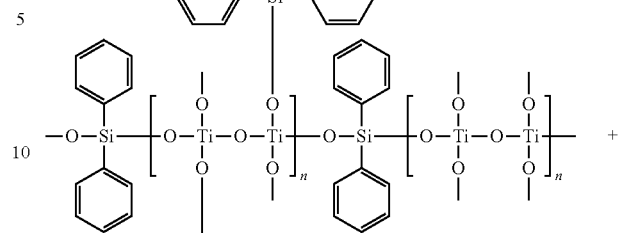

(I)
n = 5
Mw > 2,000

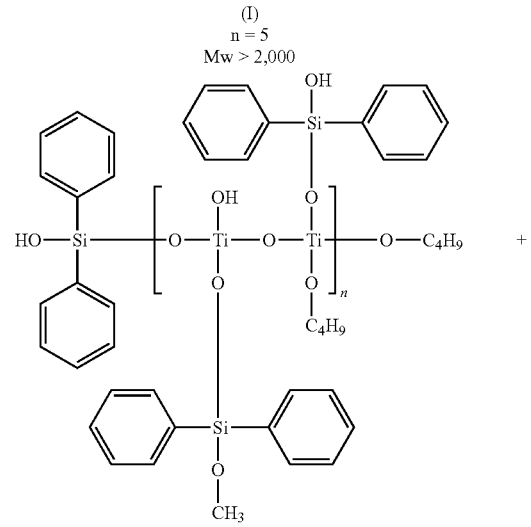

(II)
n = 5
Mw = ca. 1,600

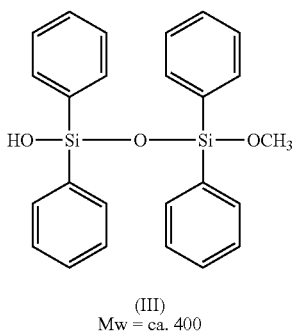

(III)
Mw = ca. 400

In the present invention, it is preferred that the number (p) of the phenyl group, the number (s) of the Si atom, and the number (m) of the metals other than Si which are contained in the organometallic compound satisfy the following relationship in the above-mentioned organometallic compound composition:

$s \leq p \leq 3s$, and $0.3s \leq m \leq 3s$.

Specifically, it is preferred that one or more and less than three phenyl groups are bonded to one Si atom, as the whole of the organometallic compound composition, from the viewpoint of the compatibility with the photopolymerizable compound and an organic polymer produced by the polymerization thereof. It is also preferred that the number (m) of the metals other than Si, such as Ti, is within the above-mentioned range in relative to the number (s) of the Si atom. If the number (m) of the other metals is less than 0.3 s, the effects of the inclusion of the two or more kinds of metals into the organometallic compound, that is, the effect that the characteristics, such as the refractive index, are easily controlled becomes small. On the other hand, if the number (m) of the other metals is more than 3 s, the organometallic compound comes to have the nature of an inorganic matrix easily as the whole of the compound so that the compatibility or flexibility falls.

In the present invention, an organic group other than the aromatic groups, for example, an alkyl group may be introduced into Si in the organometallic compound. For example, methylphenyldimethoxysilane or the like can be used as long as the advantageous effects of the present invention are not damaged. When a monoalkoxysilane such as trimethylmethoxysilane is present, the polymerization reaction is terminated. Accordingly, the monoalkoxysilane can be used to adjust the molecular weight.

The organometallic compound may contain trace amounts of elements other than the above.

In the present invention, the photopolymerizable compound is a photopolymerizable monomer. As the photopolymerizable compound, a radical polymerizable compound is preferred.

The radical polymerizable compound is not particularly limited as long as the compound has in the molecule one or more radical polymerizable unsaturated double bonds. For example, a monofunctional and multifunctional compound having a (meth)acryloyl group or a vinyl group can be used. The wording "(meth)acryloyl group" is a wording for expressing a methacryloyl group and an acryloyl group collectively.

Examples of the compound having a (meth)acryloyl group, out of the radical polymerizable compounds, include monofunctional (meth)acrylates such as phenoxyethyl (meth)acrylate, 2-methoxyethyl (meth)acrylate, 2-hydroxyethyl (meth) acrylate, benzyl (meth)acrylate, cyclohexyl (meth)acrylate, ethoxydiethylene glycol (meth)acrylate, methoxypolyethylene glycol (meth)acrylate, methyl (meth)acrylate, polyethylene glycol (meth)acrylate, polypropylene glycol (meth)acrylate, and stearyl (meth)acrylate; and polyfunctional (meth)acrylates such as trimethylolpropane tri(meth)acrylate, pentaerythritol tetra(meth)acrylate, dipentaerythritol hexa(meth)acrylate, diethylene glycol di(meth)acrylate, triethylene glycol di(meth)acrylate, tetraethylene glycol di(meth)acrylate, polyethylene glycol di(meth)acrylate, bis(2-hydroxyethyl)isocyanurate di(meth)acrylate, and 2,2-bis[4-(acryloxy-diethoxy)phenyl]propane. However, the compound having a (meth)acryloyl group is not necessarily limited thereto.

Examples of the compound having a vinyl group include monofunctional vinyl compounds such as monovinylbenzene, and ethylene glycol monovinyl ether; and polyfunctional vinyl compounds such as divinylbenzene, ethylene glycol divinyl ether, diethylene glycol divinyl ether, and triethylene glycol divinyl ether. However, the compound having a vinyl group is not necessarily limited thereto.

One kind of the radical polymerizable compound may be used, and two or more kinds thereof are used together. In the case of making the refractive index of the organometallic compound high and making the refractive index of the organic polymer low, in the present invention, a compound having no aromatic group to have low refractive index (for example, refractive index of 1.5 or less) is preferred out of the above-mentioned radical polymerizable compounds. In order to make the compatibility with the organometallic compound better, preferred is a more hydrophilic glycol derivative such as polyethylene glycol (meth)acrylate and polyethylene glycol di(meth)acrylate.

It is advisable that in the present invention the photopolymerizable compound is used, for example, in an amount of about 5 to 1,000% by weight of total of the organometallic compound, preferably in an amount of 10 to 300% by weight thereof. If the amount is less than 5% by weight, a large refractive index change is not easily obtained at the time of recording. If the amount is more than 1,000% by weight, a large refractive index change is not easily obtained, either, at the time of recording.

In the present invention, it is preferred that the hologram recording material composition further contains a photopolymerization initiator corresponding to the wavelength of recording light. When the photopolymerization initiator is contained in the hologram recording material, the polymerization of the photopolymerizable compound is promoted by the light exposure at the time of recording. Consequently, a higher sensitivity is achieved.

When a radical polymerizable compound is used as the photopolymerizable compound, a photo radical initiator is used. Examples of the photo radical initiator include Darocure 1173, Irgacure 784, Irgacure 651, Irgacure 184 and Irgacure 907 (each manufactured by Ciba Specialty Chemicals Inc.). The content of the photo radical initiator is, for example, about 0.1 to 10% by weight, preferably about 0.5 to 5% by weight on the basis of the radical polymerizable compound.

The hologram recording material composition preferably contains a dye that functions as a photosensitizer corresponding to the wavelength of recording light or the like besides the photopolymerization initiator. Examples of the photosensitizer include thioxanthones such as thioxanthen-9-one, and 2,4-diethyl-9H-thioxanthen-9-one; xanthenes; cyanines; melocyanines; thiazines; acridines; anthraquinones; and squaliriums. It is advisable to set a amount to be used of the photosensitizer into the range of about 5 to about 50% by weight of the radical photoinitiator, for example, about 10% by weight thereof.

The following will describe the production of the hologram recording material layer.

First, the above-mentioned organometallic compound is prepared by hydrolysis and polymerization reaction such as a sol-gel process or the like. For example, a diphenylalkoxide compound of Si and an alkoxide compound of Ti are used as starting materials, and the both starting materials are subjected to hydrolysis and polymerization reaction, thereby yielding a composition of the organometallic compound containing Si and Ti as constituting metals, including diphenylsilane units, and having various molecular weights.

The hydrolysis and polymerization reaction can be carried out according to almost the same operations and conditions as in known sol-gel processes. For example, the metal alkoxide compounds (the diphenylalkoxide compound of Si and the alkoxide compound of Ti), as the starting materials, the ratio therebetween being the determined ratio, are dissolved into a preferred organic solvent as above described to prepare a homogeneous solution. An appropriate acid catalyst is dropped into the solution. The solution is stirred in the presence of water, whereby the reaction can be conducted. The amount of the solvent is not limited, and is preferably 10 to 1,000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis polymerization reaction can be generally conducted at room temperature, which depends on the reactivity of the metal alkoxide compounds. The reaction can be conducted at a temperature of about 0 to 150° C., preferably at a temperature of about room temperature to 50° C. The reaction time may be appropriately determined, correspondingly to the relationship with the reaction temperature. The time is about 0.1 to 240 hours. The reaction may be conducted in an inert atmosphere such as nitrogen gas, or may be conducted under a reduced pressure of about 0.5 to 1 atom while the alcohol produced by the polymerization reaction is removed.

Before, during or after the hydrolysis, the photopolymerizable organic compound is mixed. The photopolymerizable organic compound may be mixed with the metal alkoxide compounds as the starting materials after, during or before the hydrolysis. In the case of the mixing after the hydrolysis, it is preferred to add and mix the photopolymerizable organic compound in the state that the sol-gel reaction system containing the organometallic compound is sol in order to perform the mixing uniformly. The mixing of a photopolymerization initiator or photosensitizer can also be conducted before, during or after the hydrolysis.

A hologram recording material solution is obtained wherein the photopolymerizable organic compound and the sol-state organometallic compound are uniformly mixed. The hologram recording material solution is applied onto a substrate, and then the drying of the solvent and sol-gel reaction are advanced, thereby yielding a film-form hologram recording material layer. In such a way, the hologram recording material layer is produced wherein the photopolymerizable organic compound is uniformly contained in the organometallic compound.

The thus-obtained hologram recording material layer has a high transmittance to a blue laser. Therefore, even if a thickness of the recording material layer is set to 100 μm, a recording medium having a light transmittance of 50% or more, preferably 55% or more at a wavelength of 405 nm is obtained when the medium is a transmitted light reproducing type medium; or a recording medium having a light reflectance of 25% or more, preferably 27.5% or more at a wavelength of 405 nm is obtained when the medium is a reflected light reproducing type medium. In order to attain holographic memory recording characteristics such that a high multiplicity is ensured, necessary is a recording material layer having a thickness of 100 μm or more, preferably 200 μm or more. According to the present invention, however, even if the thickness of the recording material layer is set to, for example, 1 mm, it is possible to ensure a light transmittance of 50% or more at a wavelength of 405 nm (when the medium is a transmitted light reproducing type medium), or a light reflectance of 25% or more at a wavelength of 405 nm (when the medium is a reflected light reproducing type medium).

When the above described hologram recording material layer is used, a hologram recording medium having a recording layer thickness of 100 μm or more, which is suitable for data storage, can be obtained. The hologram recording medium can be produced by forming the hologram recording material in a film form onto a substrate, or sandwiching the hologram recording material in a film form between substrates.

In a transmitted light reproducing type medium, it is preferred to use, for the substrate(s), a material transparent to a recording/reproducing wavelength, such as glass or resin. It is preferred to form an anti-reflection film against the recording/reproducing wavelength for preventing noises or give address signals and so on, onto the substrate surface at the side opposite to the layer of the hologram recording material. In order to prevent interface reflection, which results in noises, it is preferred that the refractive index of the hologram recording material and that of the substrate are substantially equal to each other. It is allowable to form, between the hologram recording material layer and the substrate, a refractive index adjusting layer comprising a resin material or oil material having a refractive index substantially equal to that of the recording material or the substrate. In order to keep the thickness of the hologram recording material layer between the substrates, a spacer suitable for the thickness between the substrates may be arranged. End faces of the recording material medium are preferably subjected to treatment for sealing the recording material.

About the reflected light reproducing type medium, it is preferred that the substrate positioned at the medium surface side into which a reproducing laser light is irradiated is made of a material transparent to a recording and reproducing wavelength, such as glass or resin. As the substrate positioned at the medium surface side opposite to the medium surface side into which a reproducing laser light is irradiated, a substrate having thereon a reflective film is used. Specifically, a reflective film made of, for example, Al, Ag, Au or an alloy made mainly of these metals and the like is formed on a surface of a rigid substrate (which is not required to have a light-transmitting property), such as glass or resin, by vapor deposition, sputtering, ion plating, or any other film-forming method, whereby a substrate having thereon the reflective film is obtained. A hologram recording material layer is provided so as to have a predetermined thickness on the surface of the reflective film of this substrate, and further a light-transmitting substrate is caused to adhere onto the surface of this recording material layer. An adhesive layer, a flattening layer and the like may be provided between the hologram recording material layer and the reflective film, and/or between the hologram recording material layer and the light-transmitting substrate. It is also unallowable that these optional layers hinder the transmission of the laser light. Others than this matter are the same as in the above-mentioned transmitted light reproducing type medium.

The hologram recording medium made of a single layer, which is the hologram recording material layer, without having any supporting substrate may be obtained, for example, by forming the hologram recording material layer onto a substrate by application, and then peeling off the hologram recording material layer from the substrate. In this case, the hologram recording material layer is, for example, a layer having a thickness in the order of millimeters. The substrate used in this case may be a substrate made of glass, resin or the like. The surface of the substrate may be subjected to a peeling treatment in advance.

According to the hologram recording medium of the present invention, the recording material layer is uniform; thus, a problem of light scattering is not caused. Further, at the time of recording, the photopolymerizable organic compound is turned into a polymer in the exposed portion; the preferred organometallic compound has the organometallic unit, wherein two aromatic groups are bonded directly to one metal, so that the organometallic compound is very good compatible with the polymer. Therefore, according to the hologram recording medium of the present invention, the compatibility is sufficiently kept and problems of light scattering and a fall in the transmittance are not caused when or after recording is performed.

Accordingly, the hologram recording medium of the invention is suitable for a system wherein record/reproduction are made using a laser light having a wavelength of 350 to 450 nm.

EXAMPLES

The present invention will be specifically described by way of the following examples; however, the invention is not limited to the examples.

Example 1

Diphenyldimethoxysilane and a titanium butoxide oligomer represented by the following structural formula were used to produce a hologram recording material by a sol-gel method in accordance with steps described below:

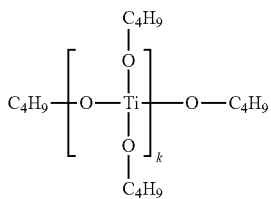

k = 10

(Synthesis of a Matrix Material)

In 40 mL of a solvent of 1-methoxy-2-propanol, 7.8 g of diphenyldimethoxysilane and 7.2 g of the titanium butoxide oligomer (B-10, manufactured by Nippon Soda Co., Ltd.) were mixed to prepare a metal alkoxide solution. Namely, the ratio by mole of Si/Ti was 1/1.

A solution made of 2.1 mL of water, 0.3 mL of a 1 N aqueous solution of hydrochloric acid, and 5 mL of 1-methoxy-2-propanol was dropwise added to the metal alkoxide solution at a room temperature with stirring. The stirring was continued for 2 hours to conduct a hydrolysis reaction. In this way, a sol solution of an organometallic compound was obtained wherein the ratio by mole of Si/Ti/phenyl groups was 1/1/2.

(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.3 part by weight of thioxanthen-9-one as a photosensitizer to prepare a mixture containing the photopolymerizable compound.

(Hologram Recording Material Solution)

The sol solution and the mixture containing the photopolymerizable compound were mixed with each other at room temperature to set the ratio of the organometallic compound (as a nonvolatile component) and that of the photopolymerizable compound to 67 parts by weight and 33 parts by weight, respectively, to obtain a hologram recording material solution substantially transparent and colorless.

(Hologram Recording Material)

With reference to FIG. 1, which schematically illustrates a cross section of a hologram recording medium, explanation will be described.

A glass substrate (22) having a thickness of 1 mm and having one surface on which an anti-reflection film (22a) was formed was prepared. A spacer (24) having a predetermined thickness was put on a surface of the glass substrate (22) on which the anti-reflection film (22a) was not formed, and the hologram recording material solution obtained was applied onto the surface of the glass substrate (22). The resultant was dried at a room temperature for 1 hour, and then dried at 40° C. for 24 hours to volatilize the solvent. Through this drying step, the gelation (condensation reaction) of the organometallic compound was advanced so as to yield a hologram recording material layer (21) having a dry film thickness of 400 μm wherein the organometallic compound and the photopolymerizable compound were uniformly dispersed.

(Hologram Recording Medium)

The hologram recording material layer (21) formed on the glass substrate (22) was covered with another glass substrate (23) having a thickness of 1 mm and having one surface on which an anti-reflection film (23a) was formed. At this time, the covering was carried out in such a manner that a surface of the glass substrate (23) on which the anti-reflection film (23a) was not formed would contact the surface of the hologram recording material layer (21). In this way, a hologram recording medium (11) was obtained which had a structure wherein the hologram recording material layer (21) was sandwiched between the two glass substrates (22) and (23).

(Evaluation of Characteristics)

Figure 2:
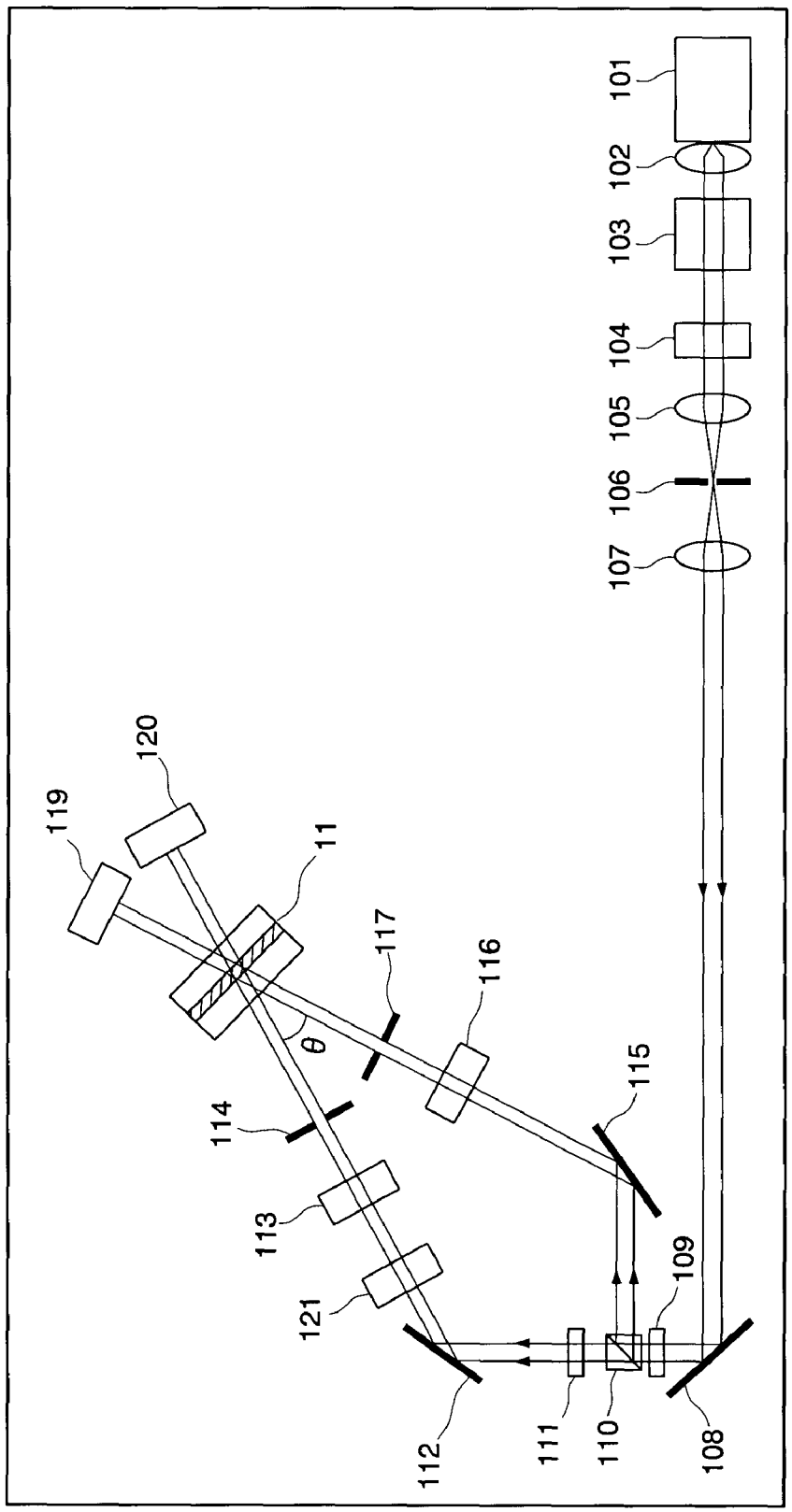
FIG. 2 is a plane view illustrating the outline of a hologram recording optical system used in the example.

About the resultant hologram recording material sample, characteristics thereof were evaluated in a hologram recording optical system as illustrated in FIG. 2. The direction along which the paper surface on which FIG. 2 is drawn stretches is defined as a horizontal direction for convenience sake.

In FIG. 2, the hologram recording medium sample (11) was set to make the recording material layer perpendicular to the horizontal direction.

In the hologram recording optical system illustrated in FIG. 2, a light source (101) for emitting a semiconductor laser (wavelength: 405 nm) in a single mode oscillation was used. Light emitted from this light source (101) was subjected to a spatial filtrating treatment by means of a beam rectifier (102), a light isolator (103), a shutter (104), a convex lens (105), a pin hole (106), and a convex lens (107), so as to be collimated, thereby enlarging the light into a beam diameter of about 10 mmφ. The enlarged beam was passed through a mirror (108) and a ½ wavelength plate (109) to take out 45° (45 degree) polarized light. The light was split into an S wave and a P wave (the ratio of S wave/P wave is 1/1) through a polarized beam splitter (110). The S wave obtained by the splitting was passed through a mirror (115), a polarizing filter (116), and an iris diaphragm (117) while a ½ wavelength plate (111) was used to convert the P wave obtained by the splitting to an S wave and then the S wave was passed through a mirror (112), a polarizing filter (113) and an iris diaphragm (114). In this way, the total incident angle θ of the two light fluxes irradiated into the hologram recording medium sample (11) was set to 37°, so as to record interference fringes of the two light fluxes in the sample (11).

The sample (11) was rotated in the horizontal direction to attain multiplexing (angle multiplexing; sample angle: −21° to +21°, angular interval: 3°) and further the sample (11) was rotated around an axis perpendicular to the surface of the sample 11 to attain multiplexing (peristrophic multiplexing; sample angle: 0 to 90°, angular interval: 10°), thereby recording a hologram. The multiplicity was 150. At the time of the recording, the sample was exposed to the light while the iris diaphragms (114) and (117) were each set into 4φ.

Details of this multiple recording will be described hereinafter. The sample (11) was rotated in the horizontal direction (around the axis perpendicular to the paper surface) from −21° to +21° at angular intervals of 3° to attain multiplexing. Thereafter, the sample (11) was rotated at 10° (i.e., 10° when it was viewed from the side into which the laser light was irradiated) around the axis perpendicular to the surface of the sample (11). The sample (11) was again rotated in the horizontal direction from −21° to +21° at angular intervals of 3° to attain multiplexing. This was repeated 10 times to rotate the sample (11) around the axis perpendicular to the surface of the sample (11) from 0° to 90°, thereby attaining multiple recording giving a multiplicity of 150.

A position where the angle of the surface of the sample (11) to a central line (not illustrated) for dividing the angle θ made by the two light fluxes into two equal parts was 90° was defined as a position where the angle in the horizontal rotation was ±0°. The axis perpendicular to the surface of the sample (11) is as follows: when the sample (11) is rectangular, the axis is a perpendicular axis passing at an intersection point of the two diagonal lines; and when the sample (11) is circular, the axis is a perpendicular axis passing at the center of the circle.

In order to react remaining unreacted components after the hologram recording, a sufficient quantity of light was irradiated by use of only one light fluxes. At the time of reproduction, with shading by the shutter (121), the iris diaphragm (117) was set into 3φ and only one light flux was irradiated. The sample (11) was continuously rotated into the horizontal direction from −23° to +23° and further rotated around the axis perpendicular to the surface of the sample (11) from 0° to 90° at angular intervals of 10°. In the individual angle positions, the diffraction efficiency was measured with a power meter (120). When a change in the volume (a recording shrinkage) or a change in the average refractive index of the recording material layer is not generated before and after the recording, the diffraction peak angle in the horizontal direction at the time of the recording is consistent with that at the time of the reproduction. Actually, however, a recording shrinkage or a change in the average refractive index is generated; therefore, the diffraction peak angle in the horizontal direction at the time of the reproduction is slightly different from the diffraction peak angle in the horizontal direction at the time of the recording. For this reason, at the time of the reproduction, the angle in the horizontal direction was continuously changed and then the diffraction efficiency was calculated from the peak intensity when a diffraction peak made its appearance. In FIG. 2, reference number (119) represents a power meter not used in this example.

At this time, a dynamic range M/# (the sum of the square roots of the diffraction efficiencies) was a high value of 17.8, which was a converted value corresponding to the case that the thickness of the hologram recording material layer was converted to 1 mm. A light transmittance of the medium before the recording exposure to the light (i.e., at the initial stage) was 71% at 405 nm. A fall in the light transmittance of the medium after the recording at 405 nm (i.e., the recording wavelength) was not observed.

At this time, a reduction ratio in the light transmittance on the basis of the glass substrates (22) and (23) each having the anti-reflection film was 0.6%. Specifically, with reference to FIG. 1, a laser light was irradiated into the sample (11) from the side of the substrate (22), so as to be transmitted toward the side of the substrate (23); in this case, 0.3% of the light was reflected on the interface between the air and the anti-reflection film (22a) by the presence of the anti-reflection film (22a), and 99.7% thereof was transmitted (absorption: 0%), and 0.3% of the transmitted light (that is, 99.7%) was reflected on the interface between the anti-reflection film (23a) of the substrate (23) and the air. As a result, 99.4% of the original laser light was transmitted.

The refractive index of the glass substrates (22) and (23) was substantially equal to that of the hologram recording material layer (21); therefore, reflection on the interface between the glass substrate (22) and the recording material layer (21) and reflection on the interface between the recording material layer (21) and the glass substrate (23) may be neglected.

Comparative Example 1

A hologram recording material solution was prepared and a hologram recording medium was produced in the same manner as in Example 1 except that instead of 1-methoxy-2-propanol, tetrahydrofuran was used as the solvent in the synthesis of the matrix material.

About the resultant hologram recording medium sample, characteristics thereof were evaluated in the same manner as in Example 1. At this time, a dynamic range M/# was 8.7, which was a converted value corresponding to the case that the thickness of the hologram recording material layer was converted to 1 mm, and was a lower value than in Example 1.

A light transmittance before recording exposure to light (i.e., at the initial stage) was 43% at 405 nm. The value was lower than the transmittance in Example 1. After the recording, the transmittance was far lower. When the portions exposed to the light were observed with naked eyes after the recording, the transparency was declined and the portions were clouded. It is presumed that this result was based on the generation of phase separation between the matrix made of the organometallic compound and the photopolymerizable compound. In other words, it appears that because of a low transmittance before the recording exposure to the light, heat at the time of the exposure accumulated easily in the medium so that the diffusion of the monomer and the polymerization reaction thereof advanced in a state that the temperature of the recording layer was raised. For this reason, it can be considered that the size of the monomer-polymerized phase and that of the matrix phase became giant with ease so that the light was scattered and the above-mentioned cloudiness was generated.

The above-mentioned example is about the transmitted light reproducing type medium having a light transmittance of 50% or more at a wavelength of 405 nm; however, it is evident that by use of a similar hologram recording material layer, a reflected light reproducing type medium having a light reflectance of 25% or more at a wavelength of 405 nm can be also produced.

What is claimed is:

1. A hologram recording medium comprising at least a hologram recording material layer,
   wherein the hologram recording material layer comprises at least:
   an organometallic compound having at least a Ti—O bond and a Si—O bond which is a hydrolysis and polymerization product of an alkoxide compound of Ti and a diaryl dialkoxide compound of Si, and
   a photopolymerizable organic compound; and
   said hologram recording medium has a light transmittance of 50% or more at a wavelength of 405 nm, or a light reflectance of 25% or more at a wavelength of 405 nm, wherein the organometallic compound is obtained by subjecting an alkoxide compound of the corresponding metal(s) to a hydrolysis and a polymerization reaction in an organic solvent which contains no cyclic ether skeleton and no carbonyl oxygen, wherein the organic solvent is at least one selected from the group consisting of a monoalcohol and a monoalkyl ether of a dialcohol.

2. The hologram recording medium according to claim 1, wherein the hologram recording material layer further comprises a photopolymerization initiator.

3. The hologram recording medium according to claim 1, wherein the hologram recording material layer has a thickness of at least 100 μm.

4. The hologram recording medium according to claim 1, wherein record/reproduction of said hologram recording medium are made using a laser light having a wavelength of 350 to 450 nm.

5. The hologram recording medium according to claim 1, wherein the alkoxide compound of Ti is titanium butoxide or an oligomer thereof, and the diaryl dialkoxide compound of Si is diphenyldimethoxysilane.

6. The hologram recording medium according to claim 1, wherein the organometallic compound and the photopolymerizable compound are present in the form of a uniform mixture.

7. The hologram recording medium according to claim 1, wherein the number (s) of the Si atoms and the number (m) of atoms of Ti satisfies the following relationship:

$0.3s \leq m \leq 3s$.

8. The hologram recording medium according to claim 1, wherein the organometallic compound consists essentially of a hydrolysis and polymerization product of the alkoxide compound of Ti and the diaryl dialkoxide compound of Si.

* * * * *